United States Patent
Fifield et al.

(10) Patent No.: US 6,445,611 B1
(45) Date of Patent: Sep. 3, 2002

(54) METHOD AND ARRANGEMENT FOR PRECONDITIONING IN A DESTRUCTIVE READ MEMORY

(75) Inventors: John A. Fifield, Chittenden, VT (US); Chorng-Lii Hwang, Wappingers Falls; Daniel W. Storaska, Walden, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/966,142

(22) Filed: Sep. 28, 2001

(51) Int. Cl.[7] ............................................... G11C 11/24
(52) U.S. Cl. ............. 365/149; 365/189.01; 365/189.04; 365/230.06
(58) Field of Search ............................ 365/149, 230.06, 365/189.04, 196, 189.01, 189.06

(56) References Cited

U.S. PATENT DOCUMENTS 5,532,965 A * 7/1996 Kenney ................. 365/189.05
6,335,904 B1 * 1/2002 Tsuchida et al. ....... 365/230.03

* cited by examiner

Primary Examiner—David Nelms
Assistant Examiner—Thong Le
(74) Attorney, Agent, or Firm—Daryl K. Neff

(57) ABSTRACT

An arrangement and method is disclosed which works toward shortening the machine cycle of a DRAM. A data value is written to a storage capacitor of a memory cell of the DRAM, the data value being stored in the storage capacitor as one of low state and high state. During a first wordline activation cycle, a storage capacitor is preconditioned to a preconditioned voltage level. In a subsequent wordline activation cycle, a low state or a high state is written to the storage capacitor.

In an aspect of the invention, the wordline is activated in a first wordline activation cycle to begin clearing any previously stored state of the storage capacitor. This cycle may include the reading of a stored data value from the storage capacitor. Then, immediately thereafter, while maintaining the wordline activated, the storage capacitor is preconditioned to a preconditioned voltage level, as by clamping the bitline through a bitline restore device. The wordline is then deactivated. Subsequently, the wordline is activated again during a write cycle to write one of a low state and a high state to the storage capacitor to indicate a stored data value.

17 Claims, 2 Drawing Sheets

METHOD AND ARRANGEMENT FOR PRECONDITIONING IN A DESTRUCTIVE READ MEMORY

FIELD OF THE INVENTION

The present invention relates to dynamic random access memories (DRAMs) including DRAMs embedded in multi-purpose integrated circuits. More specifically, the invention relates to an arrangement and method for storing data to a DRAM.

BACKGROUND OF THE INVENTION

In the past, DRAMs have provided greater storage density than other integrated circuit memories such as static RAMs (SRAMs), in many cases at a lower cost per stored bit but at a significant penalty to access time. In the past, generally only SRAM, rather than DRAM, has been incorporated into logic integrated circuits for performance reasons. To make DRAMs more desirable for both embedded and stand-alone applications, it has therefore been a goal to decrease the access time to a memory cell within the DRAM. One way to reduce random access cycle time is to shorten the machine cycle, measured as the total time between rising edges of the wordline activation signal.

Conventional DRAMs in which an NFET transistor is used in the memory cell are constrained in that it takes longer to write the storage capacitor of the memory cell to a "1" (high voltage state) from a "0" (low voltage state) than it takes to write the storage capacitor to a "0" from a "1". One solution to this inequality has been to lengthen the machine cycle for writing to accommodate the longest expected write delay, which in this case is the time required to write a "1" to a storage capacitor which currently stores a "0", even though many times a storage capacitor will actually be written in less time depending upon the prior state and the state to be stored. This not optimized because it counteracts the goal of reducing DRAM access time by shortening the machine cycle.

SUMMARY OF THE INVENTION

Accordingly, the present invention provides an arrangement and method which works toward shortening the machine cycle of a DRAM. With the present invention, a data value is written to a storage capacitor of a memory cell of the DRAM, the data value being stored in the storage capacitor as one of low state and high state. During a first wordline activation cycle, a storage capacitor is preconditioned to a preconditioned voltage level. In a subsequent wordline activation cycle, a new data value is written by writing a low state or a high state to the storage capacitor.

In an aspect of the invention, the wordline is activated in a first wordline activation cycle to begin clearing any previously stored state of the storage capacitor. Then, immediately thereafter, while maintaining the wordline activated, the storage capacitor is preconditioned to a preconditioned voltage level. The wordline is then deactivated. Subsequently, the wordline is activated again during a write cycle to write one of a low state and a high state to the storage capacitor to write a new data value.

Preferably, the first wordline activation cycle includes a read cycle in which any previously stored state is read from the storage capacitor. Preferably, the preconditioned voltage level has a value such that time required to write the high state approximately equals time required to write the low state. More preferably, the preconditioned voltage level is higher than a midpoint between a voltage Vblh indicating high state and a voltage Vlow indicating low state.

In a preferred embodiment, a method is provided for refreshing a once preconditioned storage capacitor of a dynamic random access memory (DRAM) to assist readiness for a subsequent write operation. The method operates upon storage capacitors which have already been preconditioned for writing, but which might not have been written within the interval of a refresh cycle. In some cases, the storage capacitors may have been refreshed once according to the method described here. Therefore, the storage capacitors store a voltage ranging from about the preconditioned voltage level to a high state voltage level ("1") At those current voltage levels, the refresh operation results in such storage capacitors being written to the "1" state. Such refresh method integrates well with the herein described preconditioning and writing methods, because it requires no change in the basic read and write cycle components therein. The method includes activating a wordline to read a state currently stored in a storage capacitor, that state being a voltage ranging from about preconditioned voltage level to high state ("1"), the state being read as a high state ("1"). The storage capacitor is then preconditioned to a preconditioned voltage level immediately thereafter while maintaining the wordline activated. The wordline is then deactivated. Thereafter, during a writeback cycle, the wordline is activated again to store the high state ("1") which was read from the storage capacitor back to the storage capacitor again. In this manner, the storage capacitor is refreshed to high state ("1"). At the high state, the storage capacitor is ready to be written during a subsequent write cycle.

DETAILED DESCRIPTION OF THE PREFERRED EMBODIMENTS

Figure 1:
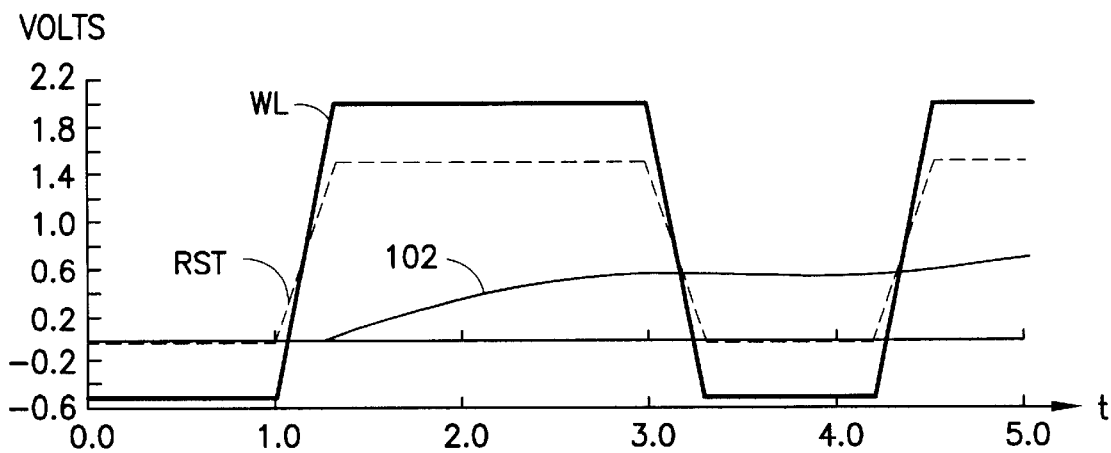
FIG. 1 illustrates a read operation in relation to which the invention is described, but which is not necessarily prior art.

FIG. 1 illustrates a read operation in relation to which the invention is described, but which is not necessarily prior art. The read operation illustrated in FIG. 1 is "destructive" in the sense that reading, i.e. sensing, the low or high voltage state stored in the storage capacitor clears the stored voltage state from the storage capacitor, and the read operation ends without writing back the previously stored state to the storage capacitor. The wordline voltage level WL is shown in FIG. 1, the wordline being activated when WL reaches an exemplary voltage of 2.0 V and being deactivated at an exemplary voltage of −0.6 V. Also shown in FIG. 1 is the bitline restore signal RST which is active low, the bitline being restored with a voltage source to a desired voltage when RST remains low, for example at 0 V, and the bitline being isolated from that voltage source when RST is high. The cell node voltage 102 represents the voltage level present in the storage capacitor of a memory cell which is coupled to the wordline.

More specifically, FIG. 1 illustrates a result of a destructive read operation to a storage capacitor which stores a low voltage state, i.e. a "0". The read operation begins with the bitline in a "restored" condition, i.e. set to a desirable initial voltage level, the wordline in a deactivated condition with WL low, and a low cell node voltage 102 representing a "0", e.g. 0 V, present at the storage capacitor. When the wordline is activated with WL going high, and RST goes high, charge transfer occurs between the storage capacitor and the bitline, thus causing the bitline voltage to fall. This voltage change is sensed by a sense amplifier coupled to the bitline to read the stored data bit of "0". Meanwhile, the cell node voltage rises, since charge is transferred therefrom to the bitline. By the time that the wordline is deactivated with VL going low again, which effectively stops any further charge transfer between storage capacitor and bitline, the cell node voltage may have risen to a level at about the midpoint between the low voltage state Vlow and high voltage state Vblh, to which the bitline is driven for storing data values of "0" and "1" respectively. The previously stored voltage state is thus "cleared" from the storage capacitor.

During the restore interval following the read operation when the wordline is deactivated by WL falling low and bitline restore (RST) falls low, the bitline voltage is driven to a desirable level, e.g. Vblh, while the cell node voltage remains constant because no conductive path exists between the storage capacitor and bitline. A DRAM arrangement in which a destructive read operation is performed as shown in FIG. 1 may advantageously employ a rule that a write operation can only occur to a storage capacitor in which any previously stored voltage state has been cleared. Thus, in such arrangement, when a subsequent write operation begins, the cell node voltage 102 has a value which is near the midpoint between Vlow and Vblh. Then, in the subsequent write operation, the cell node voltage 102 need only be raised or lowered by about half the difference between Vlow and Vblh. Under these conditions, the wordline activation interval for both read and write operations can be set to the worst case delay, that being the time needed to raise the cell node voltage from about 1/2 Vblh to Vblh, in the case that the storage capacitor originally stores a low state voltage for a "0". The machine cycle duration, in turn, includes the worst case delay wordline activation interval plus the immediately following bitline restore interval.

Figure 2:
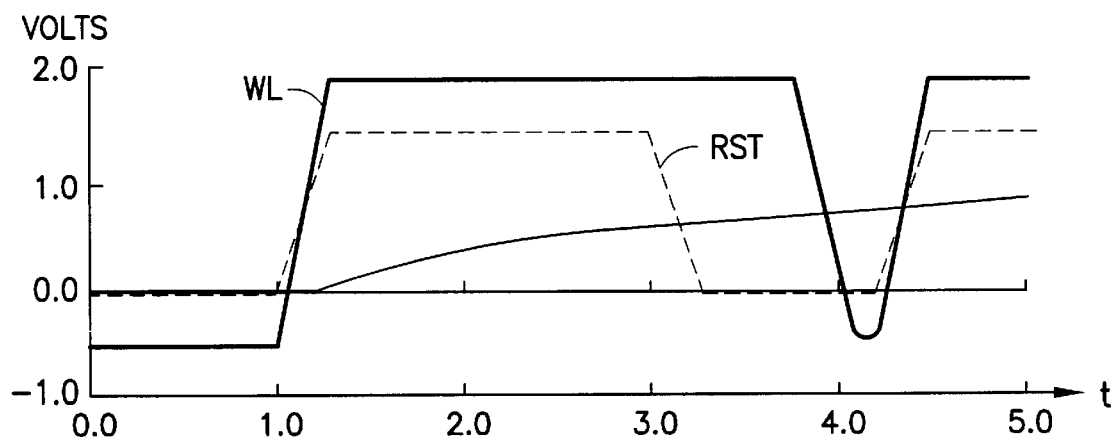
FIG. 2 is a timing diagram illustrating a preconditioning operation according to an embodiment of the present invention.

While the above arrangement bases the machine cycle duration on a worst delay, that being the time required to write a "1" after an originally stored "0", it would be desirable to further shorten such delay, and consequently, the machine cycle. Accordingly, as illustrated with respect to FIGS. 2, 3 and 4, the time required to write a "1" is shortened, thereby shortening the machine cycle. In the embodiment illustrated in FIG. 2, the time required to write a "1" is shortened because the storage capacitor is raised to a higher preconditioned voltage level than in the arrangement shown in FIG. 1. FIG. 2 illustrates a first cycle in which a storage capacitor previously storing a "0" is preconditioned to a preconditioned voltage level. The cycle begins with these initial conditions: cell node voltage 202 at Vlow =0 V, WL low and RST low, the bitline having been restored to a desirable level such as Vblh (bitline high voltage). When the wordline is first activated, by WL going high, the bitline restore signal RST goes high. Thereupon, charge transfer occurs between bitline and storage capacitor. After some time interval, while WL and RST remain high, the bit value stored in the storage capacitor can be read based on sensing the voltage then present on the bitline. Thus, in this case, the data value of "0" is read out to an output buffer. However, while a stored data value is sensed in the same cycle that the storage capacitor is preconditioned for a subsequent write, this is not necessary to an embodiment of the invention. It is only necessary in this cycle that storage capacitors are preconditioned with a preconditioned voltage level prior to a subsequent write cycle.

In this example in which a storage capacitor is rewritten after previously storing a "0", during a first interval shown in FIG. 2 in which both WL and RST are high, the cell node voltage 202 rises from Vlow towards the Vblh, the bitline restore voltage, thus clearing the previously stored state from the storage capacitor. Then, RST is activated by falling low, at which time any sensing operations must be concluded. The bitline is now clamped at a desired voltage, e.g. Vblh. Unlike in FIG. 1, the wordline now remains activated because WL remains high, such that the cell node voltage 202 continues to rise because of the clamped bitline. Consequently, the storage capacitor is preconditioned for a subsequent write operation. Finally, the wordline is deactivated by WL going low, the storage capacitor having been preconditioned to a preconditioned voltage level.

Figure 3:
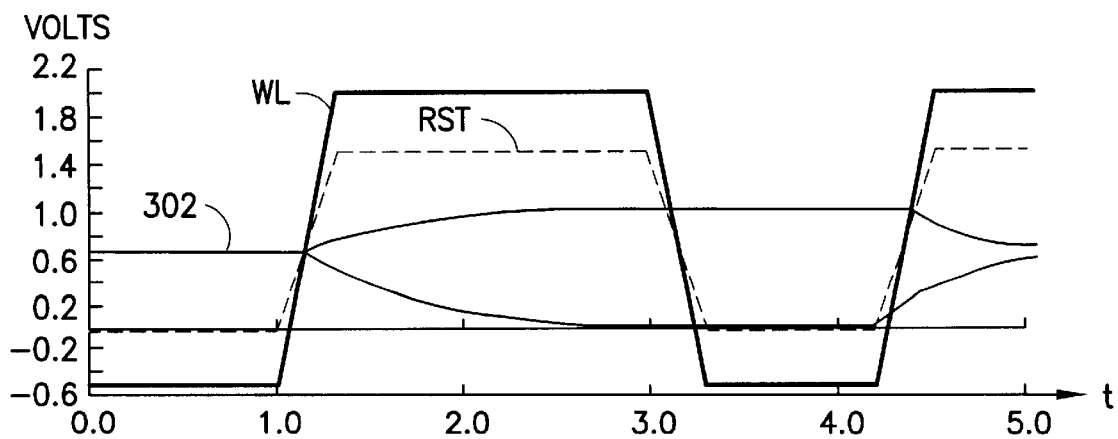
FIG. 3 is a timing diagram illustrating a write operation according to an embodiment of the present invention.

FIG. 3 illustrates a subsequent write operation performed to a storage capacitor which has been preconditioned as described above with respect to FIG. 2. The write operation begins with the cell node voltage 302 at the preconditioned voltage level. Then, when the wordline is activated by WL going high and bitline restore ends by RST going high, the cell node voltage 302 is driven towards the high state or the low state, as determined by the data value being written. By the time that the wordline is again deactivated by WL going low, the cell node voltage 302 has reached low state or high state, in each case. In the write operation shown in FIG. 3, unlike the preconditioning operation, the wordline is deactivated at the same time that bitline restore begins by RST going low, such that the storage capacitor is then isolated while the bitline voltage is restored to a ready condition. It will be apparent from FIG. 3, with the high preconditioned voltage level achievable at the storage capacitor, the time required to write a "1" to a preconditioned storage capacitor can more closely approximate the time required to write a "0" to a preconditioned storage capacitor. In such manner, a shorter, worst delay is achievable, and the machine cycle can be shortened to match this shorter, worst delay.

In a preferred embodiment, a refresh operation is implemented according to above-described two cycle read/precondition, and write method to refresh once preconditioned storage capacitors by first reading their preconditioned states as a "1" and then writing back a "1" to the storage capacitors. Thus, refreshing an already preconditioned storage capacitor results in the storage capacitor holding the high state, i.e. a "1", thereafter. As refreshed to a "1" state, the storage capacitor remains ready to be written in a subsequent write cycle, without an intervening preconditioning cycle.

The refreshing of preconditioned storage capacitors to a "1" is an advantageous result which satisfies both performance and retention concerns. Refreshing such already preconditioned storage capacitors to a "1" assures that all write-ready storage capacitors in the DRAM either store the preconditioned voltage level or the high state ("1") voltage level, or a voltage level somewhat below or between the two voltages depending on how long it has been since the operation to the storage capacitor. In any case, the time to write a new data value to such storage capacitors in a subsequent write cycle is constrained to within a known, tolerable range.

Moreover, should a subsequent refresh operation be required again before the refreshed storage capacitor is written with a new data value, that storage capacitor will again be refreshed to a "1". This may even occur on a repeated basis before the particular storage capacitor is written with a new data value. In this way, the storage capacitors' long term readiness to be written is assured.

Figure 4:
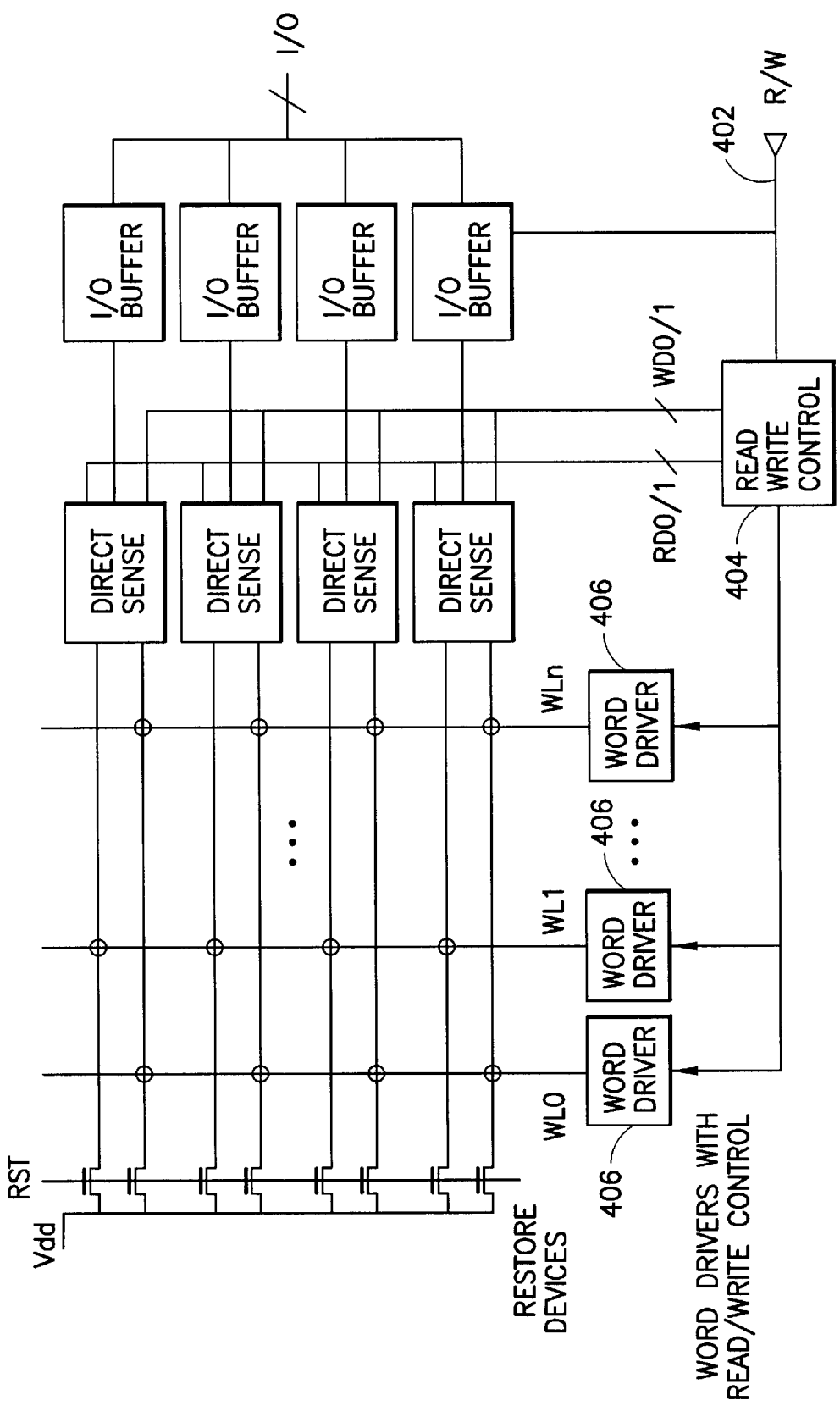
FIG. 4 is a block and schematic diagram illustrating a control arrangement according to an embodiment of the present invention.

The different requirements for timing the wordline deactivation during a preconditioning cycle (FIG. 2) and a write cycle (FIG. 3) require a change in circuitry associated with the DRAM. FIG. 4 is a block and schematic diagram illustrating exemplary circuitry for use in performing the method described above with respect to FIGS. 2 and 3. As shown in FIG. 4, a read/write control bus 402 interfaces to local read/write control block 404 for a DRAM array. Local read/write control block 404 controls the duration that wordline drivers 406 hold respective wordlines WL0, WL1, . . . WLn activated depending upon whether the operation is to precondition (including an optional read operation) or to write. Having such control in place, a precondition signal, or read signal, arriving on the read/write control bus 402 is used by read/write control block 404 to signal wordline drivers 406 to extend the wordline activation interval as shown in FIG. 2, because the operation is to precondition (and to optionally read as the case may be). On the other hand, when a write signal is present on read/write control bus 402, read/write control block 404 signals wordline drivers 406 to activate a selected wordline (one of WL0, WL1, . . . WLn) only during the shorter wordline activation interval which corresponds to bitline restore RST being disabled (high), as shown in FIG. 3.

While the invention has been described with reference to certain preferred embodiments thereof, those skilled in the art will understand the many modifications and enhancements which can be made without departing from the true scope and spirit of the invention, limited only by the claims appended below.

What is claimed is:

1. Method for writing a low state or a high state to a storage capacitor of a dynamic random access memory (DRAM), said storage capacitor being accessed by a wordline of said DRAM, said method comprising:

activating said wordline to begin clearing any previously stored state of said storage capacitor;

preconditioning said storage capacitor to a preconditioned voltage level immediately thereafter while maintaining said wordline activated;

deactivating said wordline; and activating said wordline again subsequently in a write cycle to write a selected one of a low state and a high state to said storage capacitor to indicate a stored data value.

2. The method of claim 1 wherein said preconditioned voltage level has a value such that time required to subsequently write said low state approximately equals time required to subsequently write said high state.

3. The method of claim 1 wherein said preconditioned voltage level is higher than midpoint between voltage Vblh indicating high state and voltage Vlow indicating low state.

4. The method of claim 1 wherein said storage capacitor is conductively coupled to a bitline when said wordline is activated and said method further comprises restoring said bitline to an upper voltage Vblh whenever said wordline is not activated.

5. The method of claim 1 wherein said preconditioning is performed during a read cycle.

6. The method of claim 5 wherein said wordline is activated for a longer duration during said read cycle than during said write cycle.

7. The method of claim 5 wherein said storage capacitor is preconditioned to said preconditioned voltage level during every said read cycle.

8. Method for preconditioning a storage capacitor of a dynamic random access memory (DRAM) for a subsequent write operation, said storage capacitor being accessed by a wordline of said DRAM, said method comprising:

activating said wordline to begin clearing any previously stored state of said storage capacitor;

preconditioning said storage capacitor to a preconditioned voltage level immediately thereafter while maintaining said wordline activated; and deactivating said wordline.

9. The method of claim 8 wherein said preconditioned voltage level has a value such that time required to subsequently write said low state approximately equals time required to subsequently write said high state.

10. The method of claim 8 wherein said preconditioned voltage level is higher than midpoint between voltage Vblh indicating high state and voltage Vlow indicating low state.

11. The method of claim 8 wherein said storage capacitor is conductively coupled to a bitline when said wordline is activated and said method further comprises restoring said bitline to an upper voltage Vblh whenever said wordline is not activated.

12. The method of claim 8 wherein said preconditioning is performed during a read cycle.

13. The method of claim 12 wherein said wordline is activated for a longer duration during said read cycle than during said write cycle.

14. The method of claim 12 wherein said storage capacitor is preconditioned to said preconditioned voltage level during every said read cycle.

15. The method of claim 12 wherein said read cycle occurs during a multi-cycle read and writeback refresh operation, wherein said preconditioned voltage level was stored to said storage capacitor prior to said read cycle, and said refresh operation thereby preconditions said storage capacitor to high state for a subsequent write operation.

16. Method for refreshing a storage capacitor of a dynamic random access memory (DRAM) to assist readiness for a subsequent write operation, said storage capacitor being accessed by a wordline of said DRAM and currently storing a voltage ranging from about preconditioned voltage level to a high state voltage level ("1"), said method comprising:

activating said wordline to read a state currently stored in said storage capacitor, said state being a voltage ranging from about preconditioned voltage level to high state ('1"), said state being read as a high state ("1");

preconditioning said storage capacitor to a preconditioned voltage level immediately thereafter while maintaining said wordline activated;

deactivating said wordline;

activating said wordline again during a writeback cycle thereafter to store said high state ('1") read from said storage capacitor back to said storage capacitor again, such that said storage capacitor is refreshed to high state ("1"), said storage capacitor at high state being ready to be written during a subsequent write cycle.

17. A dynamic random access memory (DRAM), comprising:

a wordline driver controllable to selectively vary the duration of wordline activation;

a wordline coupled to said wordline driver;

a bitline coupled to said wordline by a transistor controlled by said wordline;

a bitline restore device controllable to clamp said bitline to a first voltage level at a selected time, such that said wordline driver extends said duration of wordline activation during a preconditioning cycle in which said bitline at first is not clamped, and is later clamped by said bitline restore device to precondition a storage capacitor accessed by said wordline and said bitline to a preconditioned voltage level, and said wordline driver does not extend said duration of wordline activation during a subsequent write cycle, during which write cycle said bitline is not clamped.

* * * * *